(12) United States Patent
Ngo et al.

(10) Patent No.: US 7,652,537 B2
(45) Date of Patent: Jan. 26, 2010

(54) AMPLIFIER WITH PROGRAMMABLE INPUT IMPEDANCE

(75) Inventors: Tuan Van Ngo, Laveville, MN (US); Douglas Warren Dean, Eagan, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/104,849

(22) Filed: Apr. 17, 2008

(65) Prior Publication Data
US 2008/0258818 A1 Oct. 23, 2008

Related U.S. Application Data

(60) Provisional application No. 60/913,150, filed on Apr. 20, 2007.

(51) Int. Cl.
*H03G 3/00* (2006.01)
(52) U.S. Cl. .......................................... 330/282; 330/86
(58) Field of Classification Search ................. 330/252, 330/85–86, 282; 360/46, 67–68
See application file for complete search history.

(56) References Cited

U.S. PATENT DOCUMENTS

| 6,856,195 | B2 | 2/2005 | Ranmuthu | |
|---|---|---|---|---|
| 6,933,786 | B1 * | 8/2005 | Mohandas et al. | 330/308 |
| 7,088,179 | B2 | 8/2006 | Gilbert et al. | |
| 2007/0024377 | A1 * | 2/2007 | Wang et al. | 330/305 |
| 2008/0045162 | A1 | 2/2008 | Rofougaran et al. | |
| 2008/0068076 | A1 * | 3/2008 | Manstretta | 330/85 |

\* cited by examiner

*Primary Examiner*—Robert Pascal
*Assistant Examiner*—Hieu P Nguyen
(74) *Attorney, Agent, or Firm*—Dawn V. Stephens; Wade James Brady, III; Frederick J. Telecky, Jr.

(57) ABSTRACT

One embodiment of the invention includes an amplifier system. The amplifier system comprises an amplifier stage configured to receive an input signal at an amplifier input and to provide an amplified output signal. The amplifier system also comprises a programmable input impedance stage comprising a plurality of transconductance stages. At least one of the plurality of transconductance stages can be selectively activated based on a selection signal, the at least one of the activated transconductance stages providing current through the amplifier input that adjusts an impedance associated with the amplifier input based on the amplified output signal.

20 Claims, 3 Drawing Sheets

AMPLIFIER WITH PROGRAMMABLE INPUT IMPEDANCE

RELATED APPLICATION

The present application claims the benefit of U.S. Provisional Patent Application No. 60/913,150, which was filed Apr. 20, 2007, and entitled "Amplifier with Programmable Input Impedance", the entire contents of which is incorporated herein by reference.

TECHNICAL FIELD

This invention relates to electronic circuits, and more specifically to an amplifier with programmable input impedance.

BACKGROUND

Amplifier circuits, such as preamplifiers, are used in numerous applications. Typically, an amplifier is used in an electronic system to increase the amplitude of a weak signal created within the electronic system. A singled ended amplifier amplifies a single ended input signal by a gain factor, such that the output signal is equal to the input signal multiplied by the gain factor. Differential amplifiers are a particular type of amplifier wherein the differential input signal comprises a positive component and a negative component. The amplifier increases the amplitude of both input signal components by a gain factor. The ability of the amplifier circuit to faithfully reproduce the input signal is a function of many factors, including inter alia, the bandwidth of the amplifier, the frequency and/or the amplitude of the input signal, the impedance of the input system, or an associated sensor, such as a disk-drive magneto-resistive (MR) head, and transmission line impedance that provides the input signal, and the input impedance of the amplifier.

In order to obtain a relatively constant gain over the specified bandwidth of an amplifier, it is desirable to match the input impedance of the amplifier and the impedance of the input system and transmission line impedance that provides the input signal to the amplifier. If a significant mismatch exists between the input impedance of the amplifier and the system providing the input signal, signal reflections at the input to the amplifier caused by the impedance mismatch will compromise the performance of the amplifier. In such a situation, the output signal will be degraded, consequently narrowing the bandwidth over which the system can effectively operate.

The impedance of the system providing the input signal can vary significantly according to the particular system and application. In a disk-drive system, the electrical resistance of an MR head changes in response to variations in magnetic flux. The MR head is moved over the surface of a disk in order to read the data stored on the disk. The MR head reads data from a disk by sensing flux changes (e.g., changes in polarity) on the magnetic surface of an associated disk as the magnetic surface passes beneath the MR head. The flux change causes a change in the resistance of the MR head. As a function of the change in resistance, the MR head provides a corresponding change in voltage. This voltage is provided to the input of a differential amplifier which amplifies the signal for use by other components in the system.

SUMMARY

One embodiment of the invention includes an amplifier system. The amplifier system comprises an amplifier stage configured to receive an input signal at an amplifier input and to provide an amplified output signal. The amplifier system also comprises a programmable input impedance stage comprising a plurality of transconductance stages. At least one of the plurality of transconductance stages can be selectively activated based on a selection signal, the at least one of the activated transconductance stages providing current through the amplifier input that adjusts an impedance associated with the amplifier input based on the amplified output signal.

Another embodiment of the invention includes a method of amplifying an input signal. The method comprises receiving the input signal at an amplifier input of an amplifier stage and amplifying the input signal to generate an amplified output signal. The method also comprises buffering the amplified output signal via an emitter-follower stage and driving a plurality of transconductance stages that are each coupled to the amplifier input via the buffered amplified output signal. The method also comprises setting an input impedance of the amplifier input based on selectively activating and connecting at least one of the transconductance stages to provide a current flow through the amplifier input in response to an impedance selection signal.

Another embodiment of the invention includes an amplifier system. The amplifier system comprises means for amplifying an input signal that is received at an amplifier input to provide an amplified output signal and means for buffering the amplified output signal and for generating a bias voltage. The amplifier system also comprises plural means for conducting a transconductance current in response to the bias voltage. Each of the plural means for conducting can be coupled to the amplifier input. The amplifier system further comprises means for selectively activating at least one of the plural means for conducting to set an impedance associated with the amplifier input in response to an impedance selection signal by feeding back at least a portion of the transconductance current to the amplifier input.

DETAILED DESCRIPTION

This invention relates to electronic circuits, and more specifically to an amplifier with programmable input impedance. An amplifier system can include an amplifier stage, a buffer stage, and a programmable input impedance stage. The amplifier stage can be configured as a differential amplifier. An amplified output signal can be provided to drive the buffer stage, which can be configured as an emitter-follower amplifier with a level-shifting diode-connected transistor. Thus, the amplified output signal can bias the emitter-follower amplifier to generate a bias voltage at the output of the buffer stage.

The programmable input impedance stage can include a plurality of transconductance stages that each include a transconductance amplifier. The bias voltage can bias a transistor in each of the transconductance amplifiers. An impedance select signal can be provided to the programmable input impedance stage to selectively activate the transconductance stages, such that one or more of the transconductance stages can contribute to the input impedance of the amplifier system. Each of the transconductance stages can have a specific impedance associated with it. For instance, the impedance select signal can be decoded, such that a single transconductance stage can be activated at a given time to provide the specific impedance value at the input of the amplifier system.

Figure 1:
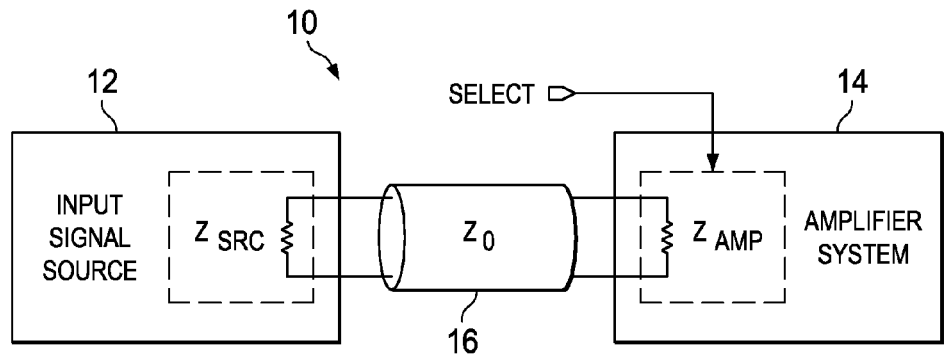
FIG. 1 illustrates an example of a signal communication system in accordance with an aspect of the invention.

FIG. 1 illustrates an example of a signal communication system 10 in accordance with an aspect of the invention. The signal communication system 10 includes an input signal source 12 coupled to an amplifier system 14 by a transmission line 16. The input signal source 12 is representative of any system that generates a signal that needs to be amplified. One such example is a magneto-resistive (MR) head utilized in disk-drive systems. The output of the input signal source 12 is a signal that is input to the amplifier system 14. The amplifier system 14 can be comprised of one or more stages, with the first stage having an input impedance for the amplifier system 14. The transmission line 16 transmits the output signal from the input signal source 12 to the amplifier system 14. In the example of FIG. 1, the transmission line 16 is demonstrated as a differential transmission line. However, it is to be understood that a single-ended transmission line could interconnect the input signal source 12 and the amplifier system 14.

In the example of FIG. 1, the impedance of the input signal source 12 is demonstrated as $Z_{SRC}$, the impedance of the amplifier system 14 is demonstrated as $Z_{AMP}$, and the impedance of the transmission line 16 is demonstrated as $Z_0$. In order to obtain a relatively constant gain over the specified bandwidth of the amplifier system 14, it is desirable to substantially match the impedance $Z_{SRC}$ of the input signal source 12 to the impedance $Z_0$ of the transmission line 16. Likewise, it is desirable to substantially match the input impedance $Z_{AMP}$ of the amplifier system 14 to the impedance $Z_0$ of the transmission line 16. Properly matching the impedances $Z_{AMP}$ and $Z_0$ substantially mitigates signal reflections, such that the matched impedance allows an output signal of the amplifier system 14, such as to a next amplification stage, to relatively accurately replicate the input signal, amplified by a gain factor of the amplifier system 14 over a specified bandwidth.

As an example, if the impedance $Z_{SRC}$ of the input signal source 12 and the impedance $Z_{AMP}$ of the amplifier system 14 are both less than or greater than the impedance $Z_0$ of the transmission line 16, then a transfer function associated with the signal communication system 10 begins to degrade at higher frequencies. As another example, if one of the impedance $Z_{SRC}$ of the input signal source 12 and the impedance $Z_{AMP}$ of the amplifier system 14 is greater than and one is less than the impedance $Z_0$ of the transmission line 16, then a transfer function associated with the signal communication system 10 has an initial peak. Thus, to obtain a relatively constant transfer function over the specified bandwidth of the amplifier system 14, the input impedance $Z_{AMP}$ of the amplifier system 14, the impedance $Z_{SRC}$ of the input signal source 12, and the impedance $Z_0$ of the transmission line 16 should be substantially matched. Accordingly, to substantially match the impedance $Z_{AMP}$ of the amplifier system 14 to the impedance $Z_0$ of the transmission line 16, the amplifier system 14 receives an impedance selection signal SELECT that programmably sets the input impedance $Z_{AMP}$ of the amplifier system 14.

Figure 2:
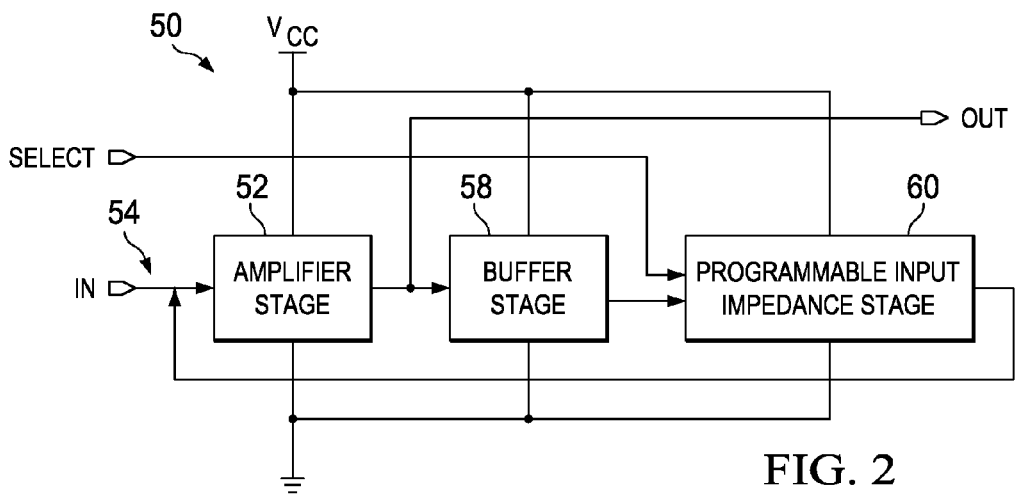
FIG. 2 illustrates an example of an amplifier system in accordance with an aspect of the invention.

FIG. 2 illustrates an example of an amplifier system 50 in accordance with an aspect of the invention. The amplifier system 50 can correspond to the amplifier system 14 in the example of FIG. 1. As an example, the amplifier system 50 can be a preamplifier system that receives signals from an MR device, such as a disk-drive read head. Thus, the amplifier system 50 can have an associated input impedance $Z_{AMP}$, such that the input impedance $Z_{AMP}$ can be set to substantially match an impedance $Z_0$ associated with the transmission line 16. Accordingly, reference is to be made to the example of FIG. 1 in the following discussion of the example of FIG. 2.

The amplifier system 50 includes an amplifier stage 52 that receives an input signal IN at an input 54 and provides an amplified version of the input signal IN as an amplified output signal OUT. As an example, the amplifier stage 52 can include a differential cascode amplifier, such that the input signal IN and the amplified output signal OUT are differential signals. In the example of FIG. 2, the amplifier system 50 is interconnected between a positive rail voltage $V_{CC}$ and a negative rail voltage, demonstrated in the example of FIG. 2 as ground. It is to be understood, however, that the amplifier system 50 could have a negative rail voltage that is greater than or less than ground (e.g., −5 volts).

The amplifier system 50 also includes a buffer stage 58. The buffer stage 58 is configured to drive a programmable input impedance stage 60 based on the amplified output signal OUT. As an example, the buffer stage 58 can include an emitter-follower amplifier and a level-shifting transistor. The amplified output signal OUT can thus drive the emitter-follower to set a bias voltage across the level-shifting transistor. The bias voltage can thus drive the programmable input impedance stage 60, such as by biasing a plurality of transconductance amplifiers that provide a current flow through the input 54.

As described above, the programmable input impedance stage 60 can include a plurality of transconductance stages. As an example, the transconductance stages can each include a transconductance amplifier, such as a transistor in series with a resistor or a parallel resistor/capacitor combination. The transistor can have an output coupled to the amplifier input 54, and can be biased by the bias voltage provided by the buffer stage 58. Thus, each of the transconductance stages can have an associated impedance value that it can provide to the amplifier input 54.

Each of the transconductance stages can be coupled to the positive rail voltage $V_{CC}$ via a switch that is controlled based on the impedance selection signal SELECT. The impedance selection signal SELECT can be a one or more bit binary signal. As an example, the impedance selection signal SELECT can close one or more of the switches to activate a respective one or more of the transconductance stages. As such, each of the activated transconductance stages can provide current through the amplifier input 54 to contribute to the input impedance $Z_{AMP}$ of the amplifier system 50. As another example, each of the transconductance stages can be configured to provide a distinct impedance at the amplifier input 54 according to the transconductance current that is provided. Thus, the impedance selection signal SELECT can be decoded, such that one of the transconductance stages can be activated at a time to provide the distinct impedance value to the amplifier input 54. Accordingly, the input impedance $Z_{AMP}$ of the amplifier system 50 can be programmably set.

Figure 3:
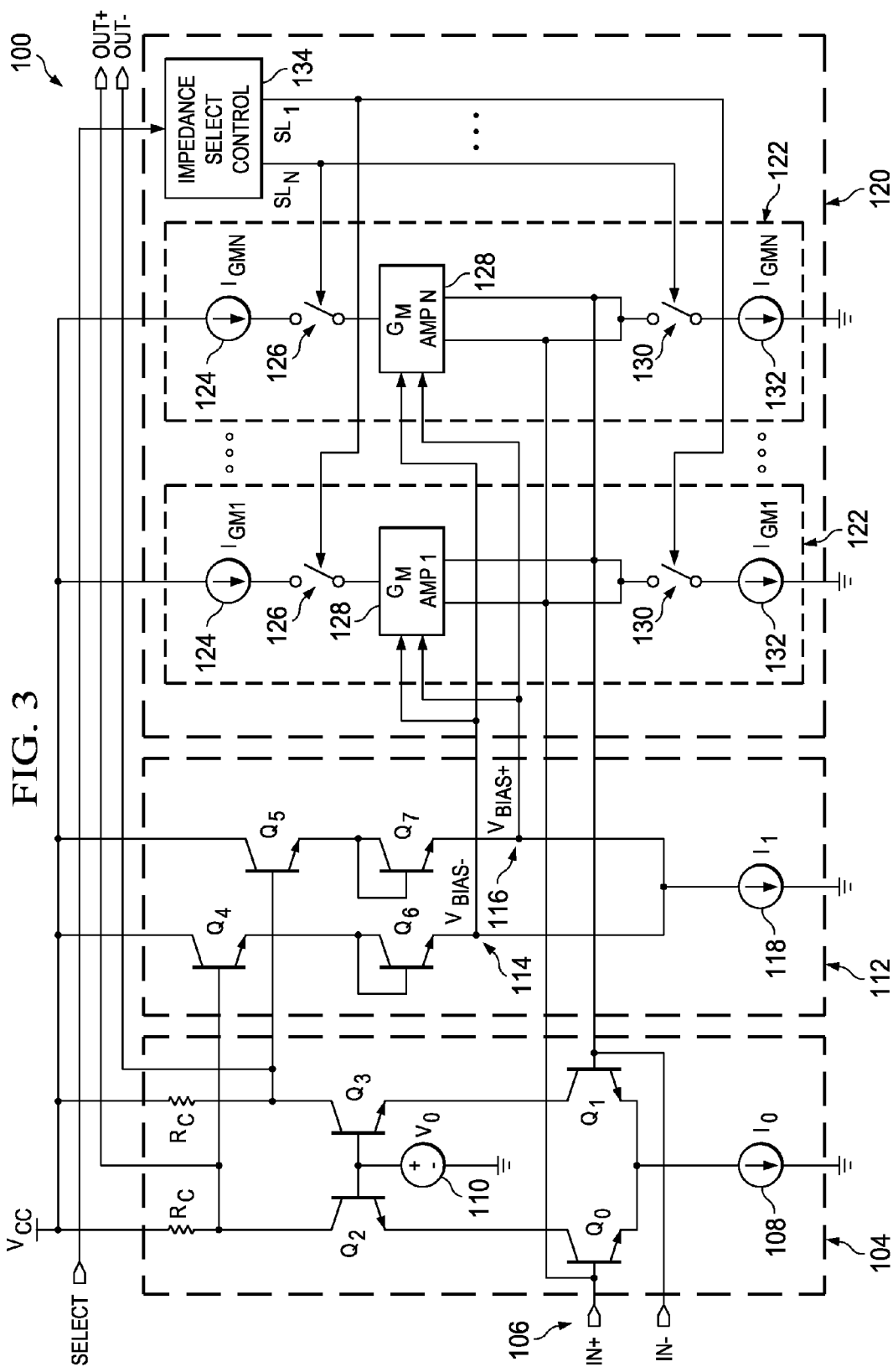
FIG. 3 illustrates another example of an amplifier system in accordance with an aspect of the invention.

FIG. 3 illustrates another example of an amplifier system 100 in accordance with an aspect of the invention. The amplifier system 100 can correspond to the amplifier system 14 in the example of FIG. 1. Thus, the amplifier system 100 can have an associated input impedance $Z_{AMP1}$ and $Z_{AMP2}$ at an input 106 for a differential input signal IN+ and IN−, respectively. As such, the input impedances $Z_{AMP1}$ and $Z_{AMP2}$ can be set to substantially match an impedance $Z_0$ (e.g., $Z_{0\_1}$ and $Z_{O\_2}$) associated with the transmission line 16. Accordingly, reference is to be made to the example of FIG. 1 in the following discussion of the example of FIG. 3.

In the example of FIG. 3, the amplifier system 100 is interconnected between a positive rail voltage $V_{CC}$ and a negative rail voltage, demonstrated in the example of FIG. 3 as ground. It is to be understood, however, that the amplifier system 50 could have a negative rail voltage that is greater than or less than ground (e.g., −5 volts). The amplifier system 100 includes an amplifier stage 104 that receives the differential input signal IN+ and IN− at the input 106. The differential input signals IN+ and IN− each bias respective transistors $Q_0$ and $Q_1$, demonstrated in the example of FIG. 3 as NPN-type bipolar junction transistors (BJTs). The transistors $Q_0$ and $Q_1$ are coupled at the emitters to a current source 108 that conducts a current $I_0$ to ground, and at the collectors to emitters of respective NPN-type BJT transistors $Q_2$ and $Q_3$. Therefore, the transistors pairs of $Q_0$ and $Q_2$ and of $Q_1$ and $Q_3$ are each arranged as cascode amplifiers. The transistors $Q_2$ and $Q_3$ are biased by a voltage source 110 that applies a voltage $V_0$ to the bases of the transistors $Q_2$ and $Q_3$. The transistors $Q_2$ and $Q_3$ are coupled at the collectors to respective gain resistors $R_C$ that interconnect a positive voltage rail $V_{CC}$ and the transistors $Q_2$ and $Q_3$. Accordingly, an amplified version of the differential input signals IN+ and IN− is provided as amplified differential output signals OUT+ and OUT− at the collectors of the transistors $Q_2$ and $Q_3$.

The amplifier system 100 also includes a buffer stage 112. The buffer stage 112 includes an NPN-type transistor $Q_4$ that is biased by the amplified output signal OUT+ and an NPN-type transistor $Q_5$ that is biased by the amplified output signal OUT−. Therefore, the transistors $Q_4$ and $Q_5$ are configured in an emitter-follower amplifier arrangement. The buffer stage 112 also includes a diode-connected NPN-type transistor $Q_6$ that is configured in series with the transistor $Q_4$ and a diode-connected NPN-type transistor $Q_7$ that is configured in series with the transistor $Q_5$. Thus, the transistors $Q_6$ and $Q_7$ are configured to level-shift the voltage across the respective transistors $Q_4$ and $Q_5$ down to set respective bias voltages $V_{BIAS-}$ and $V_{BIAS+}$ at bias nodes 114 and 116 in response to a current $I_1$ that flows to ground via a current source 118.

The amplifier system 100 further includes a programmable input impedance stage 120. The programmable input impedance stage 120 includes a plurality N of transconductance stages 122, where N is a positive integer. Each of the transconductance stages 122 includes a first current source 124 that provides a respective current $I_{GM}$, demonstrated in the example of FIG. 3 as $I_{GM1}$ through $I_{GMN}$ to correspond with the respective one of the N transconductance stages 122, which could be equal to each other or distinct relative to each other. The first current source 124 interconnects the positive rail voltage $V_{CC}$ via a first switch 126 that couples the first current source 124 to a transconductance amplifier 128. The transconductance amplifier 128 of each of the transconductance stages 122 is coupled to the amplifier input 106 and is driven by the bias voltages $V_{BIAS-}$ and $V_{BIAS+}$. Each of the transconductance stages 122 also includes a second switch 130 that couples a second current source 132 to the amplifier input 106, such that the second current source 132 provides the respective current $I_{GM}$ to ground from the amplifier input 106.

Each of the transconductance stages 122 can have an associated impedance value that can be provided to the amplifier input 106. In the example of FIG. 3, the impedance select signal SELECT is provided to an impedance select controller 134, which provides respective control signals $SL_1$ through $SL_N$ to the respective transconductance amplifiers 128. The control signals $SL_1$ through $SL_N$ thus each activate the first and second switches 126 and 130, which therefore activate the respective transconductance stage 122 to provide the respective current $I_{GM1}$ through $I_{GMN}$, which varies according to the bias voltages $V_{BIAS-}$ and $V_{BIAS+}$ as a function of the amplified output signals OUT+ and OUT−, respectively, through the amplifier input 106. As a result, the respective activated transconductance amplifier(s) 122 sets the current that is fed back through the amplifier input 106, and thus sets the input impedance $Z_{AMP}$ of the amplifier input 106.

As an example, the transconductance stages 122 can be configured substantially the same, such that one or more of the transconductance amplifiers 128 can each be configured to contribute an impedance value to the amplifier input 106 based on the respective control signals $SL_1$ through $SL_N$. As another example, each of the transconductance stages 122 can be configured differently, such as based on resistance and/or capacitance values in the transconductance amplifiers 128 or by different current values provided by the first and second current sources 124 and 132 relative to other transconductance stages 122. Thus, different input impedance values can be provided at the amplifier input 106 based on one or a combination of activated transconductance stages 122. As yet another example, each of the transconductance stages 122 can be configured differently, and the impedance select controller 134 can be configured as a decoder. As such, the impedance select signal SELECT can be decoded to assert a given one of the control signals $SL_1$ through $SL_N$ to activate one of the transconductance stages 122 at a time.

Figure 4:
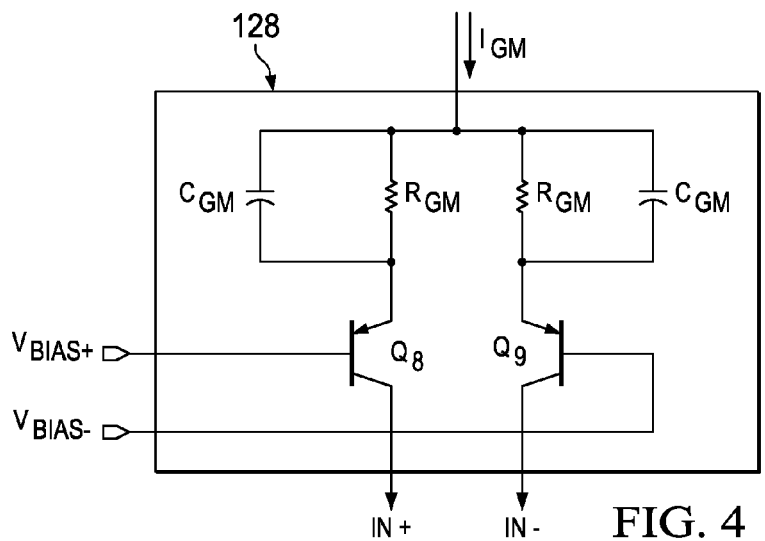
FIG. 4 illustrates an example of a transconductance amplifier in accordance with an aspect of the invention.

FIG. 4 illustrates an example of a transconductance amplifier 128 in accordance with an aspect of the invention. The transconductance amplifier 128 includes a first PNP-type transistor $Q_8$ and a second PNP-type transistor $Q_9$ that are biased, respectively, by the bias voltages $V_{BIAS+}$ and $V_{BIAS-}$. The transistors $Q_8$ and $Q_9$ are coupled at a collector to the amplifier input 106, such that the transistor $Q_8$ is coupled to the input signal IN+ and the transistor $Q_9$ is coupled to the input signal IN−. The transistors $Q_8$ and $Q_9$ are each coupled at an emitter to a parallel connection of a resistor $R_{GM}$ and a capacitor $C_{GM}$.

As an example, the resistance value of the resistor $R_{GM}$ can be selected to tune the transconductance amplifier 128 to provide a specific impedance value to the amplifier input 106. As another example, the capacitance value of the capacitor $C_{GM}$ can be selected to provide a fine adjustment to the impedance value that is provided by the transconductance amplifier 128. Thus, upon the respective transconductance stage 122 being activated based on the first and second switches 126 and 130 being activated by a respective one of the control signals $SL_1$ through $SL_N$, the respective one of the currents $I_{GM1}$ through $I_{GMN}$, demonstrated in the example of FIG. 4 as $I_{GM}$, flows through the transconductance amplifier 128 via the resistor $R_{GM}$ to the amplifier input 106. Accordingly, the transconductance amplifier 128 provides a variable current based on the bias voltages $V_{BIAS+}$ and $V_{BIAS-}$ to establish a specific impedance value at the amplifier input 106.

Because the buffer stage 112 sets the bias voltages $V_{BIAS+}$ and $V_{BIAS-}$ that drive the transconductance stages 122, the transconductance stages 122 are effectively isolated from the amplified output signal OUT+ and OUT−. As a result, the resistors $R_C$ in the amplifier stage 104 are not additionally loaded by the driving of the transconductance stages 122. In addition, voltage surges at the amplifier input 106 resulting from an initial activation of the amplifier system 100 can be mitigated based on a controlled current flow through the transconductance stages 122. Furthermore, the programmability of the input impedance $Z_{AMP}$ based on the programmable input impedance stage 120 can result in a substantial impedance match of the amplifier system 100 to an associated input transmission line, such as the input transmission line 16 in the example of FIG. 1.

It is to be understood that the amplifier system 100 and the transconductance amplifiers 128 are not intended to be limited to the respective examples of FIGS. 3 and 4. As an example, the first and second switches 126 and 130 can be controlled directly from the impedance select signal SELECT, as opposed to the dedicated control signals $SL_1$ through $SL_N$. As another example, the first and second current sources 124 and 132 can all be configured substantially the same. As such, in the case of decoded control signals $SL_1$ through $SL_N$ for the activation of a single transconductance stage 122, the second switches 130 can be obviated, such that the amplifier input 106 can be directly coupled to a single second current source 132. As another example, one or more of the transconductance amplifiers 128 can be configured without the capacitors $C_{GM}$, as the capacitors $C_{GM}$ may not be necessary for a fine adjustment of the specific impedance provided from the respective transconductance amplifier 128. Furthermore, the amplifier stage 104 need not be configured as a cascoded amplifier, but can be configured as any of a variety of amplifier types. For these reasons, it is to be understood that the amplifier system 100 can be configured in any of a variety of ways.

Figure 5:
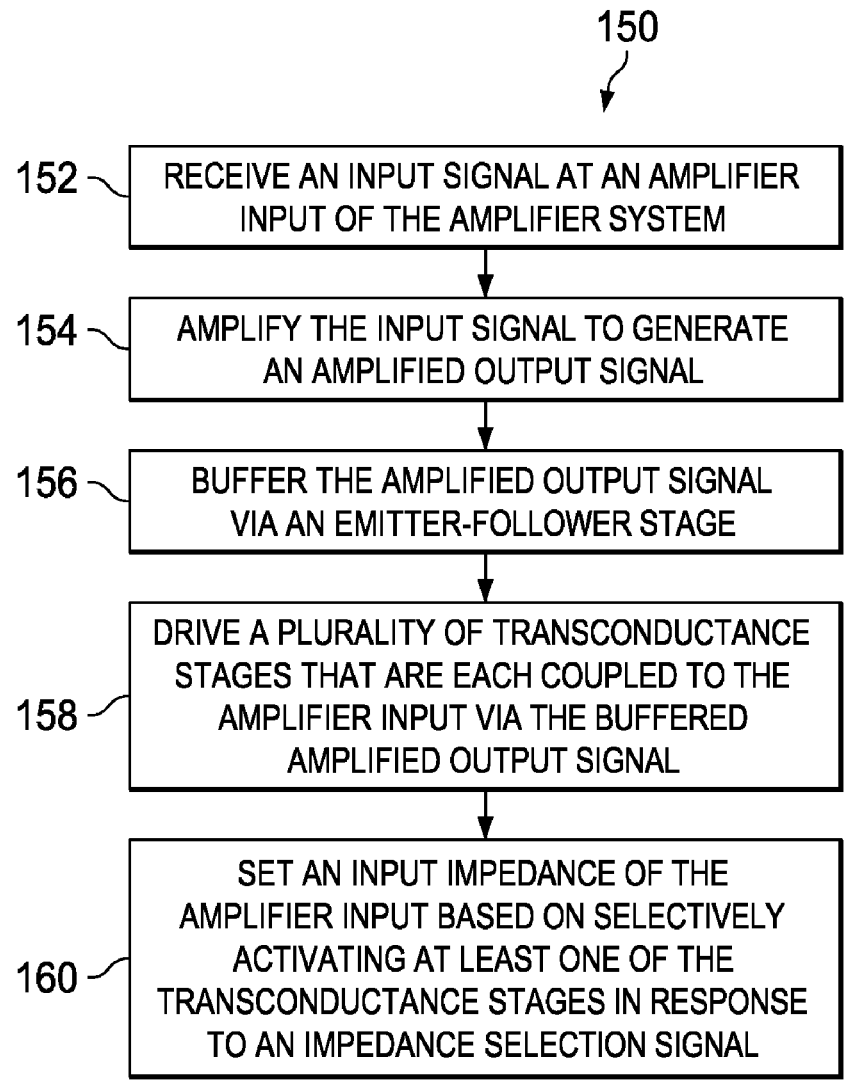
FIG. 5 illustrates an example of a method for matching an input impedance of an amplifier system to an input transmission line in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 illustrates an example of a method 150 for matching an input impedance of an amplifier system to an input transmission line in accordance with an aspect of the invention. At 152, an input signal is received at an amplifier input of the amplifier system. The input signal can be a differential signal and can be provided from the transmission line. At 154, the input signal is amplified to generate an amplified output signal. The amplified output signal can be provided to a next stage of the amplifier system, and can be amplified by a cascoded arrangement of transistors. At 156, the amplified output signal is buffered via an emitter-follower stage. The buffering of the amplified output signal can include level-shifting the output of the emitter-follower to generate a bias voltage that is the buffered and level-shifted version of the amplified output signal.

At 158, a plurality of transconductance stages that are each coupled to the amplifier input are driven via the buffered amplified output signal. The transconductance stages can include a current source and a transconductance amplifier that includes transistors that are biased by the buffered amplified output signal. At 160, an input impedance of the amplifier input is set based on selectively activating at least one of the transconductance stages in response to an impedance selection signal. The activated transconductance stage(s) can each contribute distinct impedance values or can be configured the same. The impedance selection signal can be decoded, such that a given one of the transconductance stages can be activated at a time. The activation of the transconductance stages can be in response to closing a switch to provide current flow through the transconductance stage, and thus through the amplifier input, to set the input impedance.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An amplifier system comprising:
   an amplifier stage configured to receive an input signal at an amplifier input and to provide an amplified output signal; and
   a programmable input impedance stage comprising a plurality of transconductance stages, wherein each transconductance stage of the plurality of transconductance stages is in series with at least one switched current supply, at least one of the plurality of transconductance stages being selectively activated based on a selection signal, the at least one of the activated transconductance stages providing current through the amplifier input that adjusts an impedance associated with the amplifier input based on the amplified output signal.

2. The system of claim 1, wherein the amplifier stage comprises a pair of transistors configured as a cascode amplifier.

3. The system of claim 1, wherein the selection signal is a binary-coded signal, and wherein the programmable input impedance stage comprises a decoder configured to decode the binary coded-signal to activate a respective one of the plurality of transconductance stages to provide the current through the amplifier input that adjusts the impedance associated with the amplifier input.

4. The system of claim 1, further comprising a buffer stage configured to receive the amplified output signal and to drive an input of each of the transconductance stages based on the amplified output signal.

5. The system of claim 4, wherein the buffer stage comprises an emitter-follower amplifier configured to drive each of the transconductance stages based on the amplified output signal.

6. The system of claim 4, wherein the buffer stage comprises a transistor that is biased by the amplified output signal, the transistor conducting a current from a voltage rail through a buffer output node that drives each of the transconductance stages.

7. The system of claim 6, wherein the transistor is a first transistor, the buffer stage further comprising a second transistor that is diode-connected in series with the first transistor and having an output coupled to the buffer output node, such that a level-shifted version of the amplified output signal is provided to drive the each of the transconductance stages.

8. The system of claim 6, wherein each of the transconductance stages comprises a transconductance amplifier transistor, the buffer output node being coupled to a bias input of the transconductance amplifier transistor of each of the transconductance stages.

9. The system of claim 1, wherein each of the transconductance stages has an associated impedance, such that the associated impedance is provided at the amplifier input in response to a respective one of the transconductance stages being selectively activated.

10. The system of claim 1, wherein each of the transconductance stages comprises a first current supply that provides a current from a first voltage rail, a transconductance amplifier coupled to the amplifier input and configured to conduct the first current based on the amplified output signal in response to being selectively activated, and a second current supply that provides the current from the amplifier input to a second voltage rail.

11. The system of claim 10, wherein the transconductance amplifier comprises a transistor that is biased by a buffered version of the amplified output signal and at least one of a resistor and a capacitor having a respective resistance value and capacitance value that sets a respective impedance value for the respective transconductance stage.

12. A magnetic disk-drive read system comprising the amplifier system of claim 1, the magnetic disk-drive read system comprising a magneto-resistive device configured to provide the input signal.

13. A method for matching an input impedance of an amplifier system to an input transmission line, the method comprising:
   receiving the input signal at an amplifier input of the amplifier system;
   amplifying the input signal to generate an amplified output signal;
   buffering the amplified output signal via an emitter-follower stage;
   selectively driving a plurality of transconductance stages that are each coupled to the amplifier input via the buffered amplified output signal using a switched current supply; and
   setting an input impedance of the amplifier input based on selectively activating and connecting at least one of the transconductance stages to provide a current flow through the amplifier input in response to an impedance selection signal.

14. The method of claim 13, wherein each of the plurality of transconductance stages has a respective impedance, the method further comprising decoding the selection signal to activate one of the plurality of transconductance stages to provide the respective impedance at the amplifier input.

15. The method of claim 13, wherein buffering the amplified output signal comprises:
   biasing a transistor via the amplified output signal;
   conducting a current from a positive voltage rail through the transistor;
   level-shifting a voltage across the transistor to generate a buffer output voltage node; and
   driving each of the transconductance stages in response to the buffer output voltage.

16. The method of claim 13, wherein driving the plurality of transconductance stages comprises:
   biasing a transconductance amplifier transistor of each of the plurality of transconductance stages in response to the buffered amplified output signal, the transconductance amplifier transistor of each of the plurality of transconductance stages being coupled to the amplifier input; and
   conducting a current through the transconductance amplifier transistor upon a respective one of the plurality of transconductance stages.

17. The method of claim 13, wherein setting the input impedance of the amplifier input comprises conducting a current through at least one resistor of each of the selectively activated at least one of the plurality of transconductance stages, the at least one resistor having a resistance value that is selected to provide the input impedance to the amplifier input.

18. An amplifier system comprising:
   means for amplifying an input signal that is received at an amplifier input to provide an amplified output signal;
   means for buffering the amplified output signal and for generating a bias voltage;
   plural means for conducting a transconductance current in response to the bias voltage, each of the plural means for conducting being coupled to the amplifier input, wherein each of the plural means for conducting is in series with a switched means for current supply; and
   means for selectively activating at least one of the plural means for conducting to set an impedance associated with the amplifier input in response to an impedance selection signal by feeding back at least a portion of the transconductance current to the amplifier input.

19. The system of claim 18, wherein the means for buffering comprises:
   means for conducting a current in response to the amplified output signal; and
   means for level-shifting a voltage across the means for conducting to generate the bias voltage.

20. The system of claim 18, wherein each of the plural means for conducting comprises means for providing a respective impedance magnitude associated with the respective one of the plural means for conducting based on the transconductance current.

* * * * *